(12) United States Patent
Chao et al.

(10) Patent No.: US 6,730,914 B2
(45) Date of Patent: May 4, 2004

(54) PHOTOCONDUCTOR-ON-ACTIVE-PIXEL (POAP) SENSOR UTILIZING EQUAL-POTENTIAL PIXEL ELECTRODES

(75) Inventors: Calvin Chao, Cupertino, CA (US); Tzu-Chiang Hsieh, Fremont, CA (US)

(73) Assignee: e-Phocus, Inc., San Jose, CA (US)

( * ) Notice: Subject to any disclaimer, the term of this patent is extended or adjusted under 35 U.S.C. 154(b) by 0 days.

(21) Appl. No.: 10/072,637

(22) Filed: Feb. 5, 2002

(65) Prior Publication Data

US 2003/0213915 A1 Nov. 20, 2003

(51) Int. Cl.[7] .................................................. G01T 1/24
(52) U.S. Cl. .......................... 250/370.14; 250/370.08; 438/79
(58) Field of Search ...................... 250/370.14, 370.08; 438/73

(56) References Cited

U.S. PATENT DOCUMENTS

| | | |
|---|---|---|
| 5,481,124 A | 1/1996 | Kozuka et al. |
| 5,619,033 A | 4/1997 | Weisfield |
| 5,708,263 A | 1/1998 | Wong |
| 5,747,860 A | 5/1998 | Sugiyama et al. |
| 5,801,373 A | 9/1998 | Oozu et al. |
| 5,844,292 A * | 12/1998 | Thierry ........................ 257/458 |
| 5,994,154 A | 11/1999 | Morikawa |
| 6,018,187 A | 1/2000 | Theil et al. |
| 6,046,444 A | 4/2000 | Afghahi |
| 6,054,746 A | 4/2000 | Bird et al. |
| 6,054,747 A | 4/2000 | Fang et al. |
| 6,075,253 A | 6/2000 | Sugiyama et al. |
| 6,114,739 A | 9/2000 | Theil et al. |
| 6,171,936 B1 | 1/2001 | Fitzgerald |
| 6,288,435 B1 | 9/2001 | Mei et al. |
| 6,291,811 B1 | 9/2001 | Ogawa |
| 6,303,951 B1 | 10/2001 | Sawada et al. |
| 6,307,242 B1 | 10/2001 | Sugiyama |
| 6,310,366 B1 | 10/2001 | Rhodes et al. |
| 6,605,850 B1 * | 8/2003 | Kochi et al. .................. 257/431 |
| 2002/0036700 A1 * | 3/2002 | Merrill ........................ 348/308 |

* cited by examiner

Primary Examiner—Constantine Hannaher
(74) Attorney, Agent, or Firm—Gary Eastman

(57) ABSTRACT

An active pixel sensor. A solid state radiation detection unit may be fabricated using a semiconductor substrate having a plurality of CMOS pixel circuits incorporated into the substrate. An array of pixel circuits includes within each circuit a charge collecting pixel electrode, a charge sensing node, a gate bias transistor for separating the charge collecting pixel electrode and the charge sensing node and for maintaining the pixel electrodes at substantially equal potential, and a pixel capacitor to store charges collected by the charge collecting pixel electrodes. A charge measuring circuit comprising at least one transistor may also be configured with each pixel circuit. The sensor may further include a radiation absorbing layer comprised of photoconductive material, as well as a surface electrode layer comprised of electrically conducting material.

72 Claims, 8 Drawing Sheets

Individual Pixel Cell Circuitry

(PIN Diode)

(NIP Diode)

PHOTOCONDUCTOR-ON-ACTIVE-PIXEL (POAP) SENSOR UTILIZING EQUAL-POTENTIAL PIXEL ELECTRODES

BACKGROUND OF THE INVENTION

The present invention relates to sensor arrays for sensing electromagnetic radiation, and in particular, to active pixel sensor arrays.

BACKGROUND OF THE INVENTION

Image sensors and other light sensitive sensors may be fabricated to detect the intensity of light received by the sensor. These sensors typically generate electronic signals that have amplitudes that are proportional to the intensity of the light received by the sensor. The sensors can convert an optical image into a set of electronic signals. The electronic signals may represent, for example, intensities of light received by the sensor. The electronic signals can also be conditioned and sampled to allow image processing.

One of the currently available types of image sensors is commonly referred to as an active pixel sensor. Active pixel sensors are typically fabricated using standard (CMOS) processes enabling these sensors to be integrated with digital and analog signal processing circuitry.

In conventional active pixel sensors, each pixel cell typically comprises photosensitive and non-photosensitive devices. The types of photosensitive devices include photodiodes, photoconductors, photogate MOS capacitors, and other similar devices. Non-photosensitive devices that may be found in many active pixel sensors include one or more transistors.

In many active pixel sensors, the photosensitive devices compete with non-photosensitive devices for available space on the sensor. Advances in CMOS processes permit the fabrication of sensors having pixel cells with increasing smaller geometries. As a result, the junction depth of the PN junctions and the depletion width of the MOS capacitors shrink proportionally. However, many CMOS fabricated sensors contain junction depths that are so shallow that they become much smaller than the absorption length of visible light in silicon substrate. As such, conventional active pixel sensors may suffer from deteriorating photosensitivity that may be proportional to the shrinking of the baseline CMOS process.

A variety of existing active pixel sensors are fabricated by layering a translucent conductive layer over a PIN or NIP photodiode, which is formed over a substrate. Typically, the bottom layer of the PIN or NIP photodiodes is connected to a pixel electrode that is associated with an individual pixel in the pixel cell array.

In some sensors, a voltage is applied to the top transparent conductive layer to reverse-bias the PIN (or NIP) photodiode. In conventional three-transistor pixel cells, for example, the pixel electrode is electrically shorted with the charge-collecting node of the pixel cell. Thus, during the charge integration process, the electrical potential of the pixel electrode may vary from pixel to pixel, depending on the amount of charge collected at each pixel site. In many sensors, each of an array pixel cells may have pixel electrodes that are electrically connected because they all share a common bottom layer of the PIN or NIP diode.

A problem that typically occurs when neighboring pixel electrodes are not electrically isolated from one another is commonly referred to as pixel crosstalk. Pixel crosstalk may occur in conventional active pixel sensors when current flows from higher-potential electrodes to neighboring, lower-potential, electrodes. The presence of pixel crosstalk is often undesirable because it may result in the capturing of a blurred image.

While there have been some attempts to design sensors that alleviate or minimize undesirable affects, such as pixel crosstalk, these attempts have not been entirely successful. Accordingly, a present need exists for an active pixel sensor that can provide, for example, increasingly sharper images by minimizing undesirable affects such as pixel crosstalk.

SUMMARY OF THE INVENTION

The active pixel sensor of the invention includes, in one embodiment, a solid state radiation detection unit comprising a crystalline semiconductor substrate, a plurality of complementary metal oxide semiconductor (CMOS) pixel circuits incorporated into the substrate to form an array of pixel circuits. Typically, each of the array of pixel circuits include a charge collecting pixel electrode, a charge sensing node, and a gate bias transistor separating the charge collecting pixel electrode and the charge sensing node. Each pixel circuit may further include a pixel capacitor to store charges collected by the charge collecting pixel electrode. A charge measuring circuit comprising at least one transistor may also be configured with each pixel circuitry. Typically, a gate of this transistor is electrically connected to the charge sensing node. A radiation absorbing layer comprised of photoconductive material typically covers at least a portion of the array of pixel circuits, while a surface electrode layer comprised of electrically conducting material may be formed on the radiation absorbing layer. Typically, the surface electrode layer is at least partially transparent to the electron-hole producing radiation and may be connected to a voltage source for establishing an electrical field across the radiation absorbing layer and between the surface electrode layer and each of the array of charge collecting pixel electrodes. The sensor may also be configured with an array measurement circuit for measuring charges collected by each of the array of charge collecting pixel electrodes, and if desired, for outputting pixel data indicative of the collected charges.

In accordance with one aspect of the present invention, each of the array of pixel electrodes may be maintained at substantially equal potential by the gate bias transistor.

In accordance with another aspect of the present invention, a gate of the gate bias transistor may be biased by constant voltage to minimize pixel crosstalk among adjacent pixel electrodes within the array of pixel electrodes.

In another aspect of the present invention, the charge sensing node comprises metal and provides an electrical connection to the gate of the at least one transistor in the charge measuring circuit.

In still yet another aspect of the present invention, the charge sensing node comprises polycrystalline semiconductor material and provides an electrical connection to the gate of the at least one transistor in the charge measuring circuit.

In another aspect of the present invention, the charge sensing node comprises a p-type doped region in the substrate and provides an electrical connection to the gate of the at least one transistor in the charge measuring circuits. Alternatively, the charge sensing node may comprise an n-type doped region in said substrate.

In still yet another aspect of the present invention, each of the array of pixel circuits may include, for example, either two, four, six, or more transistors.

In yet another aspect of the present invention, the pixel capacitor may be defined by the structure between the charge sensing node and the crystalline semiconductor substrate.

In accordance with another aspect of the present invention, the radiation absorbing layer comprises hydrogenated amorphous silicon.

In accordance with another aspect of the present invention, the radiation absorbing layer may be continuous layer, a discontinuous layer, a patterned layer, or some combination thereof.

In another aspect of the present invention, the radiation absorbing layer comprises trenches.

In still yet another aspect of the present invention, the radiation absorbing layer is substantially planar.

In another aspect of the present invention, the radiation absorbing layer is a continuous layer that is fabricated during a continuous deposition process.

In yet another aspect of the present invention, the radiation absorbing layer is a p-n photodiode layered structure, such that the p-layer is electrically connected to the charge collecting pixel electrode, while the n-layer is electrically connected to the surface electrode layer.

In still yet another aspect of the present invention, the radiation absorbing layer is p-I-n photodiode layered structure, such that the n-layer is electrically connected to the charge collecting pixel electrode, while the p-layer is electrically connected to the surface electrode layer.

In another aspect of the present invention, the radiation absorbing layer may be a n-I-p photodiode layered structure, such that the p-layer is electrically connected to the charge collecting pixel electrode, while the n-layer is electrically connected to the surface electrode layer.

In yet another aspect of the present invention, the p-layer comprises p-type doped hydrogenated amorphous silicon.

In accordance wit h another aspect of the present invention, the n-layer comprises n-type doped hydrogenated amorphous silicon.

In accordance with another aspect of the present invention, the I-layer comprises un-intentionally doped hydrogenated amorphous silicon.

In another aspect of the present invention, the radiation absorbing layer comprises a photoconductive un-intentionally doped layer.

In still yet another aspect of the present invention, the photoconductive un-intentionally doped layer comprises hydrogenated amorphous silicon.

In another aspect of the present invention, the charge collecting pixel electrode comprises a patterned metal plate.

In yet another aspect of the present invention, the charge collecting pixel electrode may be formed by a surface of at least one via used for interlayer connection by a semiconductor fabrication process.

In still yet another aspect of the present invention, the charge collecting pixel electrode may be formed by a surface of a single via.

In yet another aspect of the present invention, the surface electrode layer may comprise indium tin oxide, tin oxide, titanium nitride, or other similar materials.

In accordance with another aspect of the present invention, a potential difference between adjacent pixel electrodes may be in a range of about 1 to about 50 millivolts.

In still yet another aspect of the present invention, the sensor comprises a fill factor anywhere from about 40 to 80 percent, or even more.

BRIEF DESCRIPTION OF THE DRAWINGS

The nature, objects, and advantages of the present invention will become more apparent to those skilled in the art after considering the following detailed description in connection with the accompanying drawings, in which like reference numerals designate like parts throughout, and wherein.

DETAILED DESCRIPTION OF A PREFERRED EMBODIMENT

In the following description of a preferred embodiment, reference is made to the accompanying drawings, which form a part hereof, and which show by way of illustration a specific embodiment of the invention. It is to be understood by those of working skill in this technological field that other embodiments may be utilized, and structural, electrical, as well as procedural changes may be made without departing from the scope of the present invention.

The term "substrate" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to "substrate" in the following description, previous process steps may have been utilized to form regions or junctions in the base semiconductor structure or foundation, other than the pixel cell circuitry that will be described in detail herein. In addition, the semiconductor need not be silicon-based, but could be based on silicon-germanium (SiGe), germanium (Ge), gallium arsenide (GaAs), or other similar materials.

The substrate may also contain one or more circuitry regions (not shown) providing, for example, readout and control circuitry that may be necessary to support the associated pixel cell arrays. Additionally, these circuitry regions may also be fabricated to include, for example, analog-to-digital converters (ADC), digital signal processors (DSP), timing and control circuitry, as well as circuits providing image processing support. Additionally, RF circuitry may be included to accommodate the transmission and receiving requirements to support the active pixel sensor for use in a wireless imager, for example.

The term "light" is to be understood as including electromagnetic radiation comprising visible as well as invisible light.

POAP Sensor Pixel Cell Array

Figure 1:
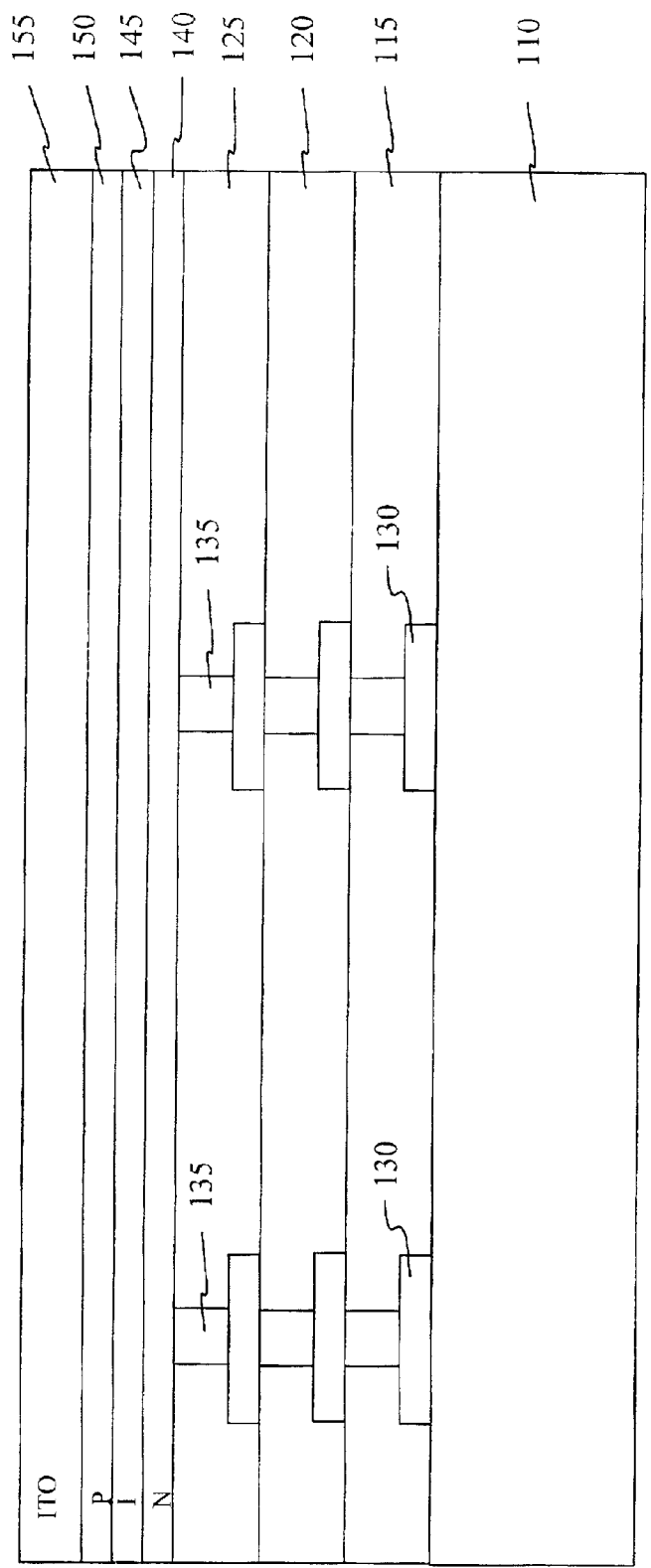
FIG. 1 is a cross-sectional diagram illustrating a first embodiment of the POAP sensor of the present invention.

Referring now to FIG. 1, a cross-sectional view of a first embodiment of the photoconductor-on-active-pixel (POAP) sensor of the present invention is shown and generally designated 100. As shown, sensor 100 includes a substrate 110 and lower, middle, and upper interconnection structures 115, 120, 125 successively formed over the substrate 110. Each of an array of pixel sensors may include an individual pixel electrode 130, which may be formed on substrate 110. As will be described in detail herein, substrate 110 may include pixel cell circuitry that provides, for example, for the reduction or elimination of pixel crosstalk.

An N-layer 140 is formed adjacent to the upper interconnect structure 125. An I-layer 145 is formed adjacent to the N-layer 140, while a P-layer 150 is formed adjacent to the I-layer 145. The P-layer 150, the I-layer 145 and the N-layer 140 form the array of PIN photodiode sensors, which will also be referred to herein as pixel sensors. Conductive vias 135 electrically connect each of the array of photodiodes to the substrate 110. A translucent conductive layer 155 is formed adjacent to the P-layer 150.

For clarity, the present invention will be described with respect to a PIN photodiode configuration. However, one of ordinary skill will realize that the active pixel sensors may include a NIP design. In such a configuration, the N-layer 140 of FIG. 3 may be replaced with a P-layer, and the P-layer 150 may be replaced with a N-layer.

Typically, the lower and middle interconnection structures 115 and 120 are standard CMOS interconnection structures. The structure and methods of forming these interconnection structures are well known in the field of electronic integrated circuit fabrication, and therefore will not be further described.

The upper interconnection structure 125 may provide reliability and structural advantages to the elevated pixel sensor structure that is shown. The upper interconnection structure 125 enables an electrical connection between the N-layer 140 and the pixel electrodes 130. The upper interconnect structure 125 may be formed from a silicon oxide, silicon nitride, or other similar materials.

The present invention will be described with specific reference made to two-layer, three-layer, and multi-layer interconnection structures. However, one of ordinary skill will realize that the number of interconnection layers utilized is not essential and additional or fewer structures may be used to accommodate a particular sensor design.

The conductive vias 135 pass through the pixel interconnect structures 115, 120, 125 and electrically connect the pixel electrodes 130 to the substrate 110. The conductive vias 135 may be formed from an appropriate electrically conductive material, such as tungsten, copper, aluminum, or other similar materials. However, tungsten is often utilized during fabrication because this material has been shown to be particularly useful in forming narrow and relatively long interconnections. Typically, the conductive vias 135 are formed using a chemical vapor deposition (CVD) process, but other processes may be used.

As shown, a single via 135 may be used for each of an array of pixels which comprise the sensor 100. However, sensor 100 may be configured so that multiple vias are used for one or more of the array of pixels, which may further enhance the electrical communication between the PIN (or NIP) layer structure and the substrate 110. A possible derivative of the present invention is to make a patterned metal electrode in electrical contact with vias 135 in each pixel as the bottom electrodes.

Typically, the PIN layers 150, 145, and 140 are fabricated with photosensitive materials, such as amorphous-silicon photodiodes. In one embodiment, the transparent conductor layer 155 may be formed from an indium tin oxide (ITO). However, other materials may be used to form the transparent conductor layer 155, including tin oxide, titanium nitride, thin silicide, and the like.

A protective layer (not shown) may also be formed over the transparent conductor 155. The protective layer may provide mechanical protection, electrical insulation, as well as providing anti-reflective characteristics. Although a protective layer may be useful, it is not essential to the invention.

POAP Sensor Circuitry

Figure 2:
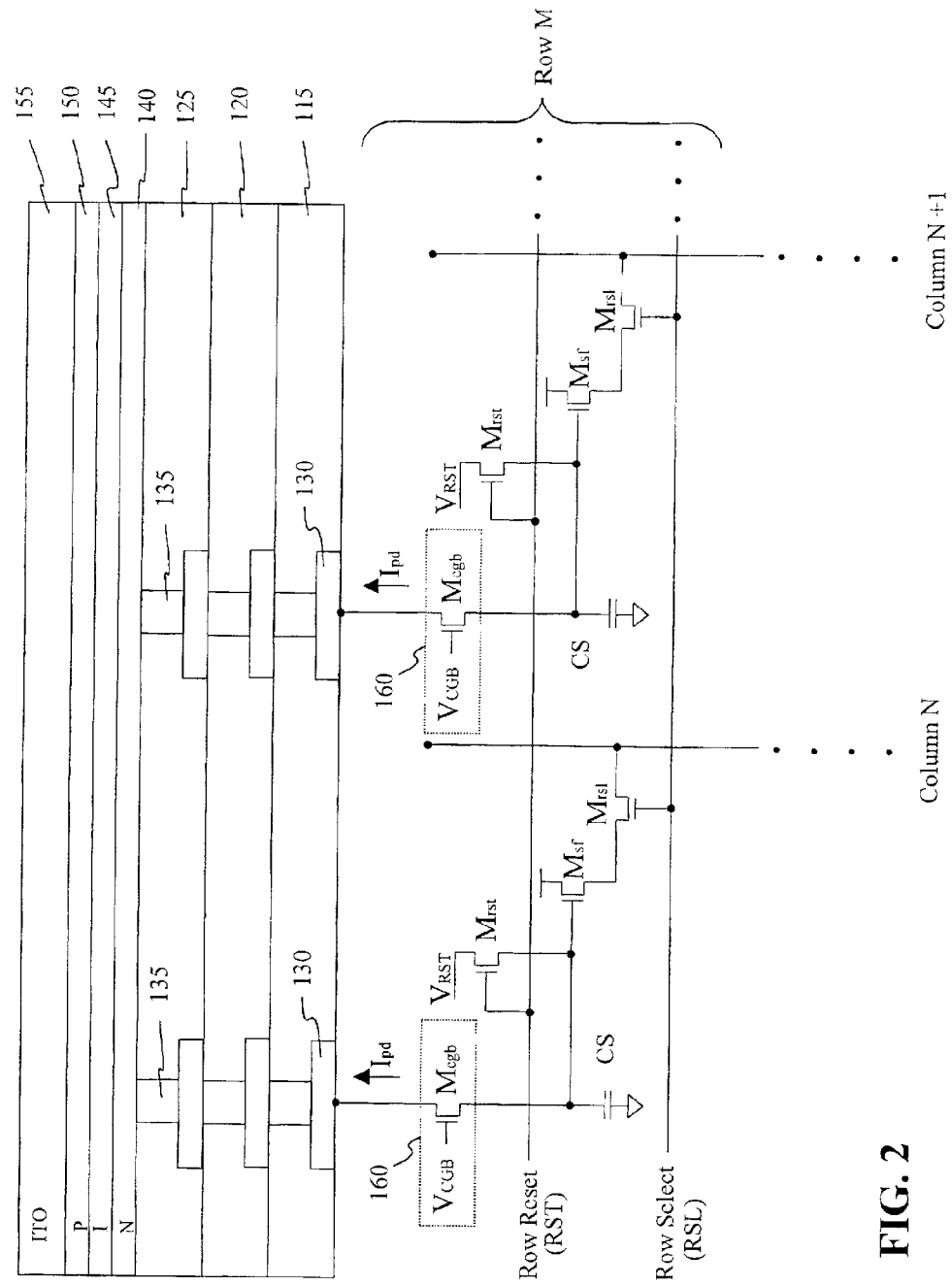
FIG. 2 is a cross-sectional diagram illustrating a first embodiment of the POAP sensor of the present invention, as well as some of the related pixel cell circuitry that may be used to support a PIN diode architecture.

Referring now to FIG. 2, a cross-sectional view of a representative POAP sensor 100, as well as some of the related pixel cell circuitry, are shown. In this Figure, each pixel electrode 130 is in electrical communication with respective pixel cell circuitry, which will now be described.

Each pixel cell, of an array of pixel cells, of the POAP sensor 100 may be configured with a total of four transistors. In particular, each pixel cell may include a conventional configuration of transistors Mrst, Msf, and Mrsl, as well as one additional transistor; namely, a gate bias transistor Mcgb 160. The gate of the transistor Mcgb is shown biased by a constant gate voltage Vcgb. It is to be appreciated, however, that the gate of transistor Mcgb may be biased by a time-varying voltage Vcgb.

Typically, the transistor Mcgb 160 is configured between the pixel electrode 130 and the charge sensing node CS. The photocurrent flowing through the source and drain of transistor Mcgb may be used to enable the pixel electrode 130 to maintain a constant (or nearly constant) electrical potential, which is lower than the constant gate bias by the threshold voltage of the transistor Mcgb 160. One aspect provided by the transistor Mcgb 160 enables the effective separation of the pixel electrode 130 and the charge sensing node CS.

This circuitry configuration typically results in the P-layer 150 having a lower potential than the N-layer 140 for a reverse bias. Further, each of the pixel electrodes 130 typically comprises lower potential than the constant gate bias.

For example, during the charge integration process, the electrical potential of each pixel electrode 130 may vary depending on the amount of optical charge collected at each pixel site. This typically occurs because each particular pixel cell array may receive a variable amount of light energy, thereby producing an equally varying electrical potential.

Sensors that utilize a traditional three-transistor pixel cell configuration, and do not incorporate a transistor Mcgb 160, may experience electrical potential differentials related to their respective light energies received. As a result, the charge sensing nodes CS of adjacent pixel cells having a limited three-transistor configuration may experience potential differences of anywhere from about 100 millivolts to about 1000 millivolts. The existence of such potential differences may result in undesirable pixel crosstalk, for example, and may increase image blurring. However, as previously described, the incorporation of the transistor Mcgb 160 according to one embodiment of the present invention enables the pixel electrode 130 to be maintained at a constant (or nearly constant) electrical potential to provide for the effective separation of the pixel electrode 130 and the charge sensing node CS.

During operation, because of the inclusion of the transistor Mcgb 160, the potential difference for pixel electrodes 130 in adjacent pixel cells may be substantially reduced. Typically, any remaining potential difference results from the threshold-voltage non-uniformity of the CMOS process, which is typically less than 10 millivolts, RMS, for state-of-art CMOS processes.

It is therefore to be understood that each pixel electrode 130, for each of an array of pixel cells, may be maintained at equal (or substantially equal) potential. As a result, pixel crosstalk may be substantially reduced, or even eliminated.

Furthermore, according to one embodiment, the isolation of the charge sensing nodes CS by the inclusion of the transistor Mcgb 160 may be implemented without the need for the patterning of the bottom N-layer 140 (or a bottom P-layer in a NIP photodiode configuration). In this embodiment, a continuous PIN layer deposition process may be utilized in the fabrication of the POAP sensor of the present invention, thereby decreasing fabrication time and expense.

The POAP sensor of the present invention may be fabricated using most any of the commercially available CMOS processes to accommodate any of a variety of pixel cell sizes and geometries. For example, the POAP sensor of the present invention may be fabricated as having a 4 $\mu$m by 4 $\mu$m pixel cell and a 0.25 $\mu$m baseline CMOS process, without increasing the pixel cell size.

It is also to be understood that photosensitive devices utilized by the present invention are not competing for space with non-photosensitive devices. As such, the fill factor of the photosensitive device may be substantially increased over existing active pixel sensors. As such, the present invention may provide fill factors of nearly 100 percent.

It is also to be realized that because of process variations of the threshold voltages of Mcgb transistors and/or the gate-to-source voltage variations among the Mcgb transistors (caused by the photocurrent variations among adjacent pixels), the reduction in the potential difference for pixel electrodes 130 in adjacent pixel cells typically will not reach zero.

The POAP sensor of the present invention may include a pixel cell array having a wide range of individual pixel cells. For example, the rows and columns of the pixel cell array may each be expanded or reduced to achieve a desired array size and configuration (e.g., 120×160, 256×256, 512×512, 1024×1024, 2048×2048, and 4096×4096, etc.) However, the present invention is not limited to a particular size or geometry, and most any array configuration, up to and including the available maximum pixel density capabilities of the CMOS fabrication process may be used. The present invention further contemplates the modification of the size of individual pixel cells, as well as the modification of the size and geometries of the pixel cells arrays, to accommodate any lens cost limitations that may exist.

Individual Pixel Cell Circuitry

Figure 3:
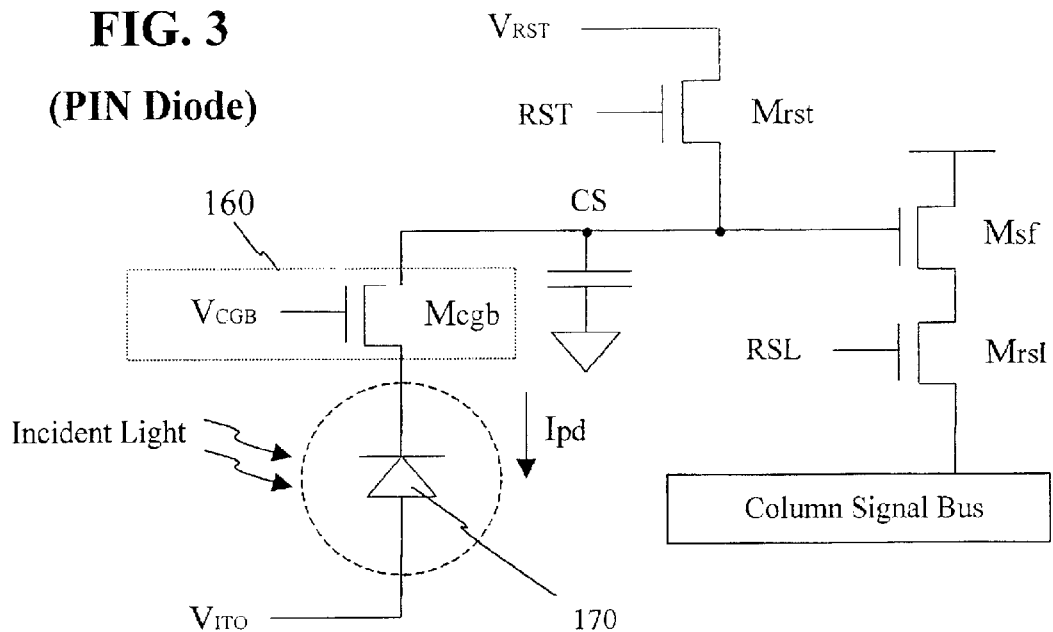
FIG. 3 is a schematic diagram of exemplary circuitry that may be used for an individual pixel cell having a PIN diode structure.

Referring now to FIG. 3, a schematic diagram of exemplary circuitry that may be used for an individual pixel cell having a PIN diode structure is shown. Again, it is to be understood that each of an array of pixel cells may be similarly constructed.

Each of the four transistors that may be used in the individual pixel cell circuitry are shown. In particular, the pixel cell is shown having transistors Mrst, Msf, and Mrsl, as well as the gate bias transistor Mcgb 160. The gate of the transistor Mcgb is shown biased by a constant gate voltage Vcgb.

The transistor Mrst acts as reset transistor whose gate is connected to the Row Reset (FIG. 2), and whose source is connected to the transistor Mcgb. A source follower transistor Msf contains a gate that is connected to transistor Mcgb. A select transistor Mrsl contains a gate that is connected to the Row Select (FIG. 2), and whose drain is connected to the source of the source follower transistor Msf.

During the charge integration process, incident light may strike photodiode 170, creating a photocurrent that may be correlated to the optical intensity of the light. The transistor Mcgb 160, which may be biased by a constant gate voltage Vcgb, is shown configured between the photodiode 170 and the charge sensing node CS. Again, the photocurrent flowing through the source and drain of transistor Mcgb may be used to enable the pixel electrode 130 (FIG. 2) to maintain a constant (or nearly constant) electrical potential.

As previously described, the present invention may be fabricated as either a PIN or NIP diode structure. Accordingly, one of ordinary skill will realize that the individual pixel cell circuitry utilizing a PIN diode structure shown in FIG. 3 may be modified to accommodate a NIP diode structure. An example of such a construction is shown in FIG. 4.

Figure 4:
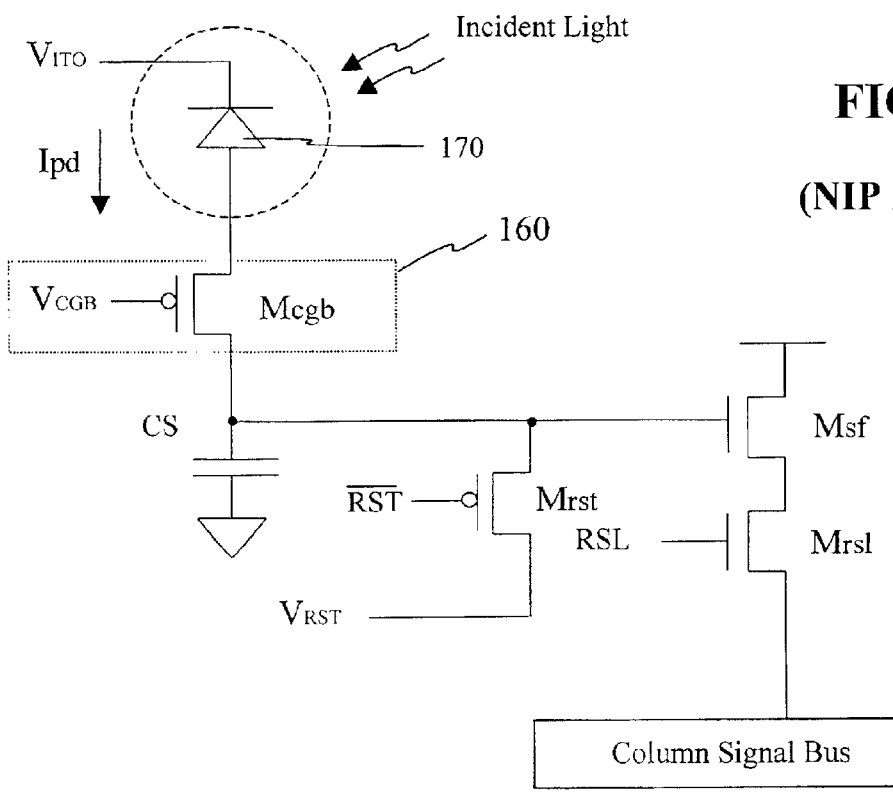
FIG. 4 is a schematic diagram of exemplary circuitry that may be used for an individual pixel cell having a NIP diode structure.

Referring now to FIG. 4, a schematic diagram of exemplary circuitry that may be used for an individual pixel cell having a NIP diode structure is shown. The various electrical components shown in this circuit are essentially similar to that shown in the PIN diode structure of FIG. 4, with modifications made to accommodate a NIP diode structure.

For example, the photodiode 170 is shown inverted as compared to the configuration in FIG. 3. Also, the gate of the reset transistor Mrst receives an inverted reset signal, denoted by signal $\overline{RST}$.

The present invention has been described as having a planar, or substantially planer, photoconductor layer (e.g., N-layer 140). However, alternative configurations are possible and within the contemplation of the present invention. For example, sensor 100 may be modified to include a non-planar photoconductor layer. By way of illustration, alternative embodiments of the present invention utilizing discontinuous, trenched, and patterned photoconductor layer configurations will now be described.

POAP Sensor Utilizing Discontinuous Photoconductor Layer

Figure 5:
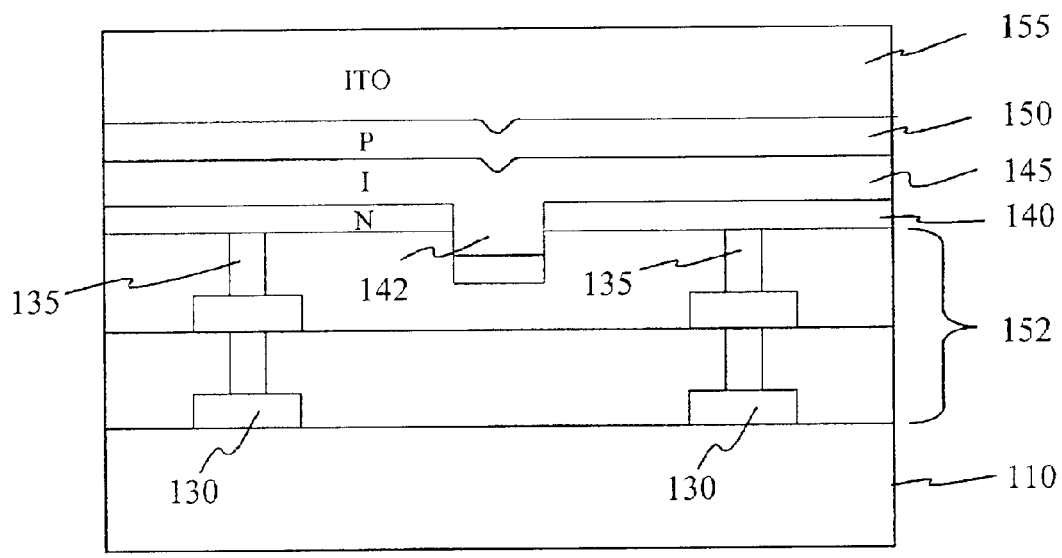
FIG. 5 is a cross-sectional diagram illustrating an alternative embodiment of the POAP sensor of the present invention utilizing a discontinuous photoconductor layer design.

Referring now to FIG. 5, a cross-sectional view of an alternative embodiment of the POAP sensor of the present invention is shown and generally designated 200. Sensor 200 is similar to sensor 100 in many respects, and may include a substrate 110 and a multi-tiered interconnection structure 152 formed over the substrate 110. Sensor 200 further includes conductive layer 155, P-layer 150, I-layer 145, and N-layer 140. Again, substrate 110 may include pixel cell circuitry that provides, for example, for the reduction or elimination of pixel crosstalk.

A notable distinction between sensor 100 and sensor 200 relates to the photoconductive layer (e.g. the n-layer in a PIN diode, or the p-layer in a NIP diode) that is in electrical communication with the conductive vias 135. In particular, sensor 200 is shown having a discontinuous N-layer 140 created by a trench 142 that is present between adjacent pixel electrodes 135. The trench configuration typically provides a particular degree of electrical isolation between adjacent pixels. However, because the discontinuous N-layer 140 of sensor 200 may be utilized in conjunction with pixel cell circuitry previously described, a sensor having increased fill factors while experiencing minimal pixel crosstalk is possible.

POAP Sensor Utilizing Trenched Photoconductor Layer

Figure 6:
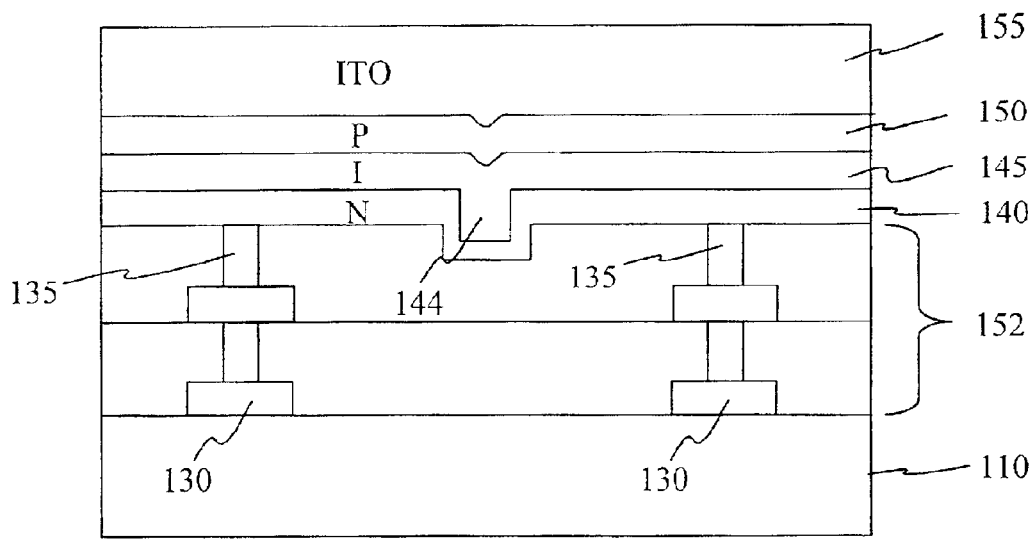
FIG. 6 is a cross-sectional diagram illustrating another alternative embodiment of the POAP sensor of the present invention utilizing a trenched photoconductor layer design.

Referring now to FIG. 6, a cross-sectional view of another alternative embodiment of the POAP sensor of the present invention is shown and generally designated 300. Sensor 300 is similar to sensor 200 in many respects. For example, sensor 300 may include a substrate 110 and a multi-tiered interconnection structure 152 formed over the substrate 110. Similarly to the other sensors, sensor 300 further includes conductive layer 155, P-layer 150, I-layer 145, and the N-layer 140. Again, substrate 110 may include pixel cell circuitry that provides, for example, for the reduction or elimination of pixel crosstalk.

Similarly to the trench design utilized in sensor 200, the sensor 300 also comprises a trench 144 between adjacent pixel electrodes 135. However, trench 144 is not as pronounced as trench 142 (sensor 200) which typically provides for a continuous N-layer 140, in contrast to the discontinuous N-layer utilized by sensor 200.

The trench configuration shown in FIG. 6 typically provides some degree of isolation between the pixel cells by increasing the resistance between the N-layers associated with neighboring pixels. The increased resistance provided solely by trench 144 typically does not provide adequate pixel cell isolation, resulting in pixel crosstalk. However, the present invention provides for any additional pixel cell isolation that may be desired by utilizing the previously described pixel cell circuitry.

POAP Sensor Utilizing Patterned Photoconductor Layer

Figure 7:
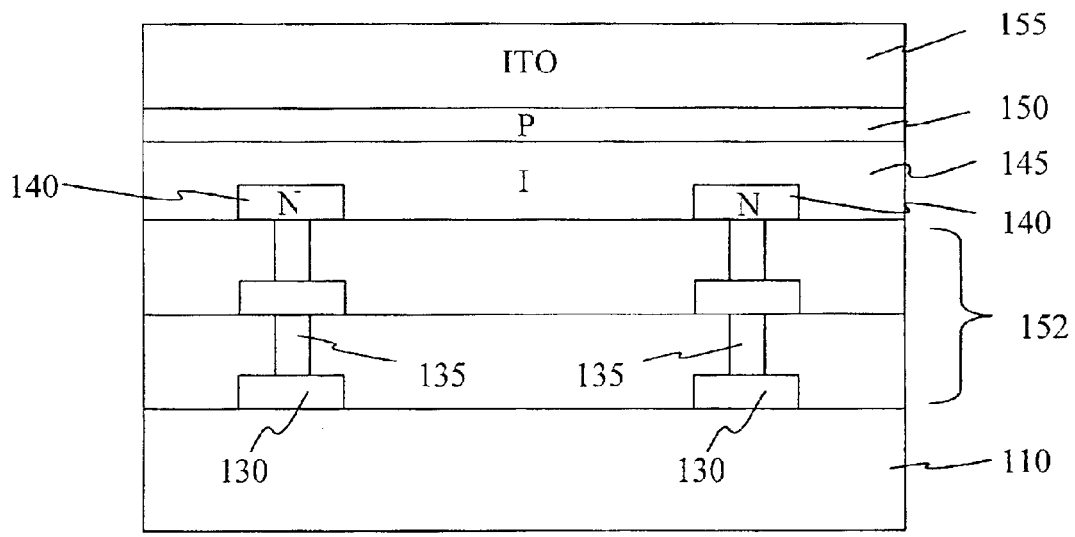
FIG. 7 is a cross-sectional diagram illustrating another alternative embodiment of the POAP sensor of the present invention utilizing a patterned photoconductor layer design.

Referring now to FIG. 7, a cross-sectional view of still another alternative embodiment of the POAP sensor of the present invention is shown and generally designated 400. Sensor 400 is similar to sensor 300 in many respects, such that sensor 400 may include a substrate 110 and a multi-tiered interconnection structure 152 formed over the substrate 110. Similarly to the other sensors previously described, sensor 400 further includes conductive layer 155, P-layer 150, I-layer 145, and the N-layer 140.

In contrast to the other sensors, the sensor 400 also comprises a patterned N-layer 140, as opposed to the trench designs utilized by sensors 200 and 300. The patterned configuration shown in FIG. 7 typically provides a degree of electrical isolation between adjacent pixel cells. However, in some applications, the electrical isolation provided solely by the patterning of the N-layer 140 may not be sufficient. As such, sensor 400 is typically configured with the previously described pixel cell circuitry so that a desired level of pixel cell isolation may be obtained.

Alternative Architecture for Individual Pixel Cells

The individual pixel cells utilized in the present invention have been described as utilizing a four-transistor pixel cell architecture. However, alternative architectures are possible and within the contemplation of the present invention. For example, the pixel cell circuitry utilized in the sensor of the present invention may include anywhere from two to six transistors, or even more. By way of illustration, alternative pixel cell architectures that may be used to maintain an equal potential over an array of pixel electrodes will now be described.

Figure 8:
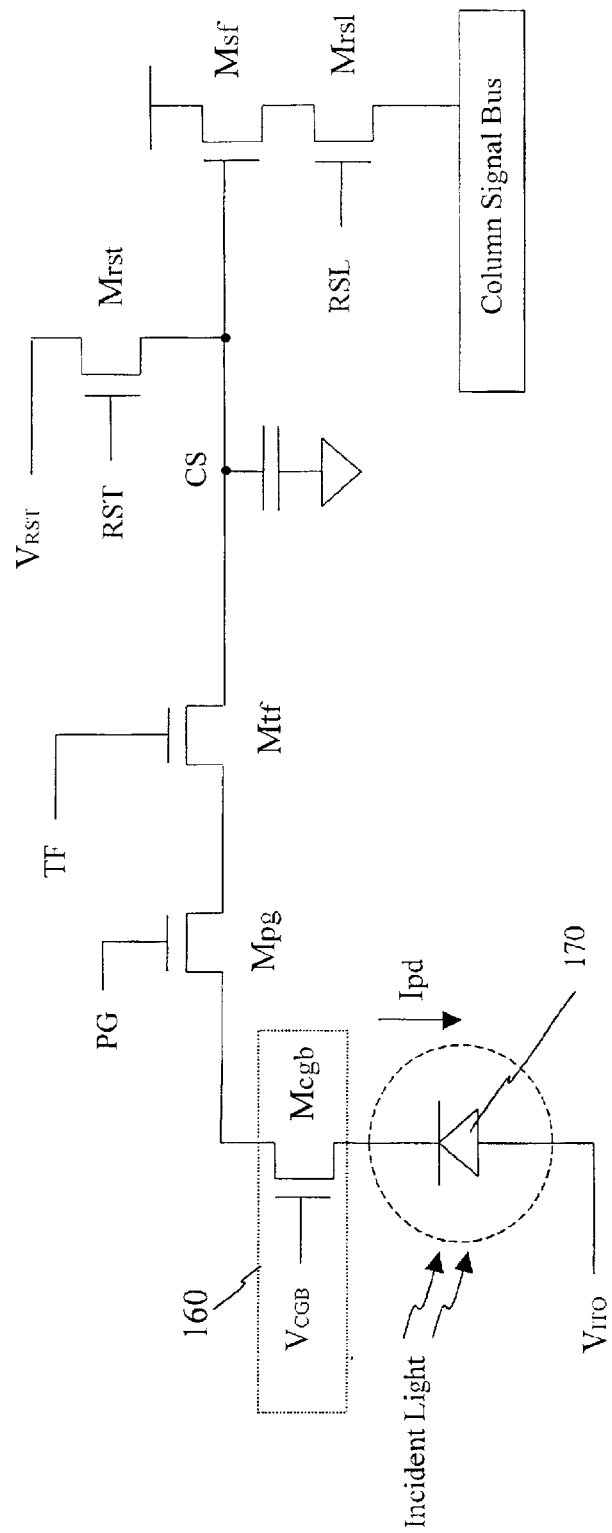
FIG. 8 is a schematic diagram of exemplary circuitry utilizing a six transistor architecture that may be used for an individual pixel cell having a PIN diode structure.

FIG. 8 is a schematic diagram of exemplary circuitry for a six-transistor pixel cell that may be used for individual pixel cells having a PIN diode structure. The circuitry shown in FIG. 8 is similar in many respects to that shown in FIG. 3. However, the circuitry in FIG. 8 comprises two additional transistors (i.e., transistors Mpg and Mtf) than that utilized in the FIG. 3 design.

In FIG. 8, the transistor Mcgb is shown biased by a constant gate voltage VCGB, so that each of an array of pixel electrodes PX may be maintained at approximately the same electrical potential. The reset transistor Mrst, the source follower transistor Msf, the row-select transistor Mrsl, as well as the gate bias transistor Mcgb function similarly as in the four-transistor pixel cell described above (FIG. 3).

A fifth transistor Mpg, the photogate transistor, may be used as a MOS capacitor to store the photo-generated charge carriers (e.g., electrons). A sixth transistor Mtf, the transfer transistor, may be used to transfer the stored charge under Mpg to the charge-sensing node CS. One advantage of utilizing a six-transistor pixel cell over a lower number transistor configuration (e.g., the four-transistor pixel cell) is that the six-transistor pixel cell architecture permits a Correlated Double Sampling (CDS) to be performed, typically resulting in a reduction of pixel readout noise.

A common technique used in CMOS sensor readout circuitry to reduce pixel-to-pixel fixed-pattern noise is called double sampling. In this technique, a reset reference voltage for each pixel may be read out and subtracted from the photo signal voltage to cancel the common offset voltages due to device mismatches, which could vary from pixel to pixel. However, each reset operation often introduces a temporal noise, commonly referred to as the KTC noise.

In the four-transistor pixel cell, for example, the charge storage node (the node that stores the photo-generated charge carriers) and the charge-sensing node (the node that converts the charge to voltage output) are typically the same node. As such, the reset reference voltage at the charge-sensing node of each pixel cell can only be read out after the photo signal voltage is read out (otherwise the stored photo charge will be wiped out); therefore, the reset reference voltage is not correlated with the photo signal voltage. Hence, the KTC noise associated with the signal voltage cannot be cancelled in the four-transistor design. The double sampling performed this way is commonly referred to as an uncorrelated double sampling. Although uncorrelated double sampling may reduce the pixel-to-pixel fixed-pattern noise, it typically can not reduce KTC noise, and in many situations, it increases the KTC noise.

On the other hand, in the case of a six-transistor pixel cell, the transfer transistor Mtf effectively separates the charge storage node (the MOS capacitor under the gate of Mpg) from the charge-sensing node. During the process of charge integration, the photogate transistor Mpg may be biased in the deep depletion mode (VPG=VDD, in the case of NMOS) and the transfer transistor is turned off. At the end of the charge integration, a reset pulse may reset the charge-sensing node. The reset reference voltage at the charge-sensing node may then be read out first.

Next, the transfer transistor may be turned on and the gate voltage of Mpg pulsed into an accumulation mode (VPG=0, in the case of NMOS) to dump the stored photo charges onto the charge-sensing node so that the photo signal voltage can be read out accordingly. Because the reset reference voltage contains the same KTC noise as in the photo signal voltage, an external subtraction of the reset reference voltage from the photo signal voltage will typically eliminate the KTC noise completely. This operation is referred to as the Correlated Double Sampling.

The six-transistor pixel cell configuration typically requires a larger pixel cell area as compared to the four-transistor pixel cell because of the two additional transistors. However, the six-transistor pixel cell configuration is particularly useful in applications where the reduction of pixel-to-pixel fixed-pattern noise while being substantially free of KTC noise is desired, even though a larger pixel cell may be required.

Figure 9:
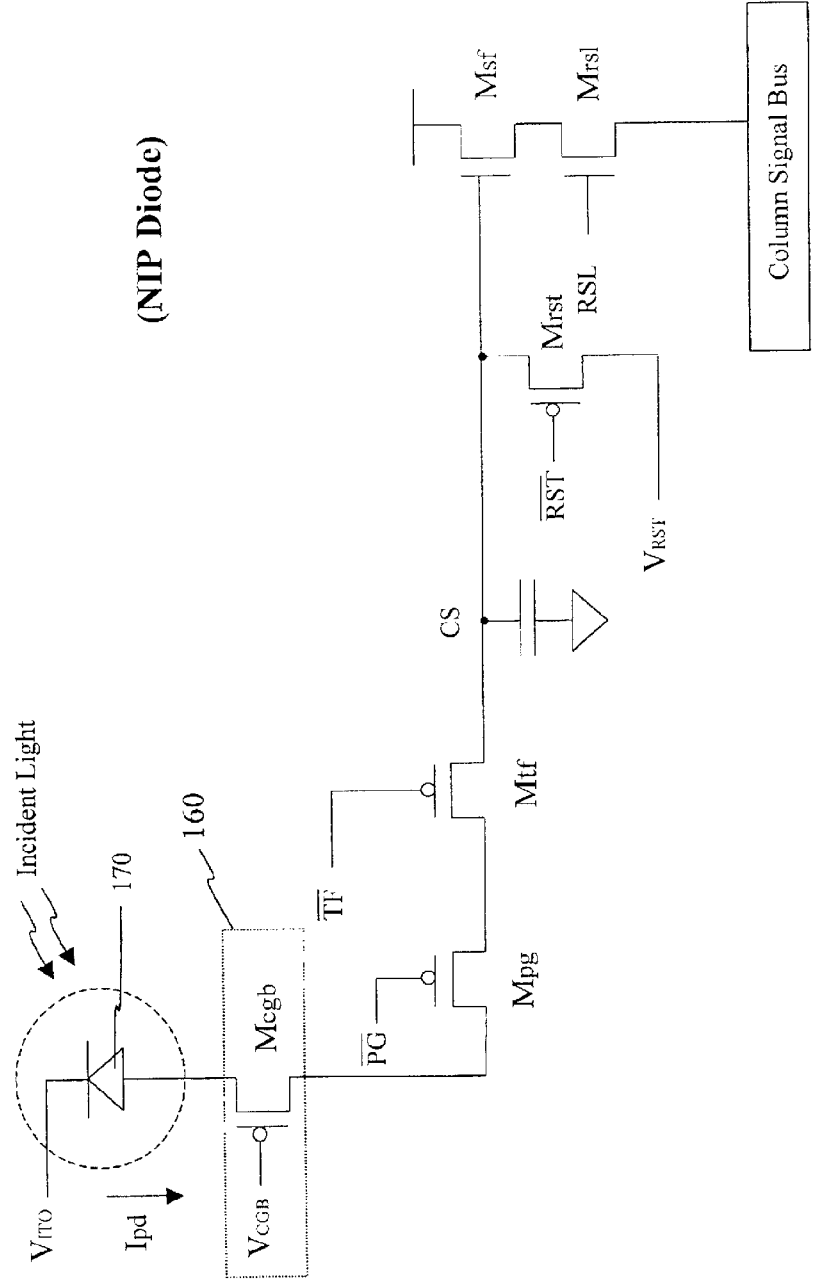
FIG. 9 is a schematic diagram of exemplary circuitry utilizing a six transistor architecture that may be used for an individual pixel cell having a NIP diode structure.

FIG. 9 is a schematic diagram of exemplary circuitry for a six-transistor pixel cell that may be used for individual pixel cells having a NIP diode structure. The various electrical components shown in this circuit are essentially similar to that shown in the PIN diode structure of FIG. 8, with modifications made to accommodate a NIP diode structure.

For example, FIG. 8 shows a six-transistor pixel cell that can be used with a PIN POAP sensor structure where electrons are collected, stored, and converted to readout voltages. In contrast, FIG. 9 shows a six-transistor pixel cell that can be used with a NIP POAP sensor structure where holes are collected, stored, and converted to readout voltages. Furthermore, the six-transistor pixel cell shown in FIG. 9 comprises inverted PG, TF, and RST signals, in contrast to non-inverted PG, TF, and RST signals utilized in the PIN diode architecture shown in FIG. 8.

NIP POAP Sensor Architecture

Figure 10:
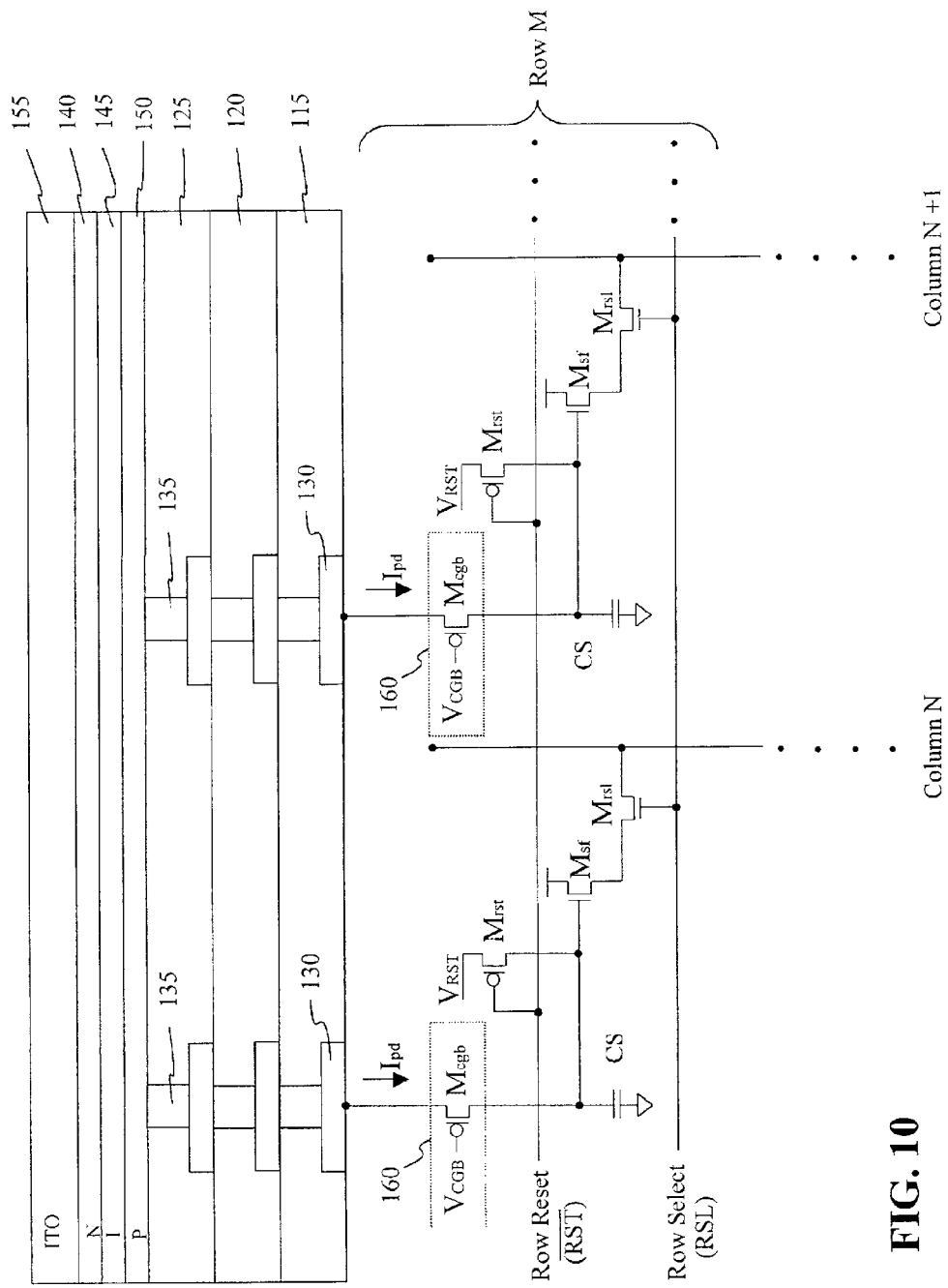
FIG. 10 is a cross-sectional diagram illustrating an alternative embodiment of the POAP sensor of the present invention, as well as some of the related pixel cell circuitry that may be used to support a NIP diode architecture.

FIG. 10 is a cross-sectional view of an alternative embodiment of the present invention and is generally designated 500. Sensor 500 includes architecture that is similar in many respects to that which may be utilized in, for example, sensor 100 (FIG. 2). In particular, sensor 500 may include a multi-tiered interconnection structure having layers 115, 120, and 125 that are formed over a substrate 110. However, sensor 500 comprises a NIP diode architecture, in contrast to the PIN diode configuration that may be utilized in the sensor 100 shown in FIG. 2.

For example, sensor 500 is shown having a conductive layer 155 formed over a radiation absorption layer comprised of an N-layer 140, I-layer 145, and a P-layer 150. An example of individual pixel cell circuitry that may be utilized in sensor 500 is shown in FIG. 10, with a more detailed circuitry description provided in the description relating to FIG. 4.

Again, the present invention is not limited to a particular circuitry design. Accordingly, one of ordinary skill will realize that that sensor 500 may be fabricated using, for example, the four-transistor pixel cell architecture shown in FIGS. 10 and 4, or the six-transistor architecture shown in FIG. 9. Additionally, sensor 500 as well as any of the other sensor embodiments may be configured with additional transistors to accommodate a particular design requirement; however, these additional transistors are not essential.

An appropriately configured sensor unit utilizing the POAP sensor architecture may be utilized in a variety of applications, including cameras, machine vision systems, vehicle navigation systems, video telephones, computer input devices, surveillance systems, auto focus systems, star trackers, motion detection systems, image stabilization systems, scanners, and other similar devices. Those who may also benefit from the use of such devices include law enforcement, medical, fire departments, emergency service and search and rescue operations, as well as the military and intelligence communities.

Additional uses may include non-destructive testing, preventative maintenance operations, commercial security applications, as well as the automotive industry for providing, for example, a driver with low light level viewing enhancement devices.

While there have been shown what are presently considered to be preferred embodiments of the present invention, it will be apparent to those skilled in the art that various changes and modifications can be made herein without departing from the scope and spirit of the invention.

What is claimed is:

1. An active pixel sensor for producing images from electron-hole producing radiation comprising:
    A) a solid state radiation detection unit comprising:
        1) a crystalline semiconductor substrate;
        2) a plurality of Complementary Metal Oxide Semiconductor pixel circuits incorporated into said substrate to form an array of pixel circuits, wherein each of said array of pixel circuits comprises:
            a) a charge collecting pixel electrode;
            b) a charge sensing node;
            c) a gate bias transistor separating said charge collecting pixel electrode and said charge sensing node and maintaining said pixel electrodes at substantially equal potential;
            d) a pixel capacitor comprising said charge collecting pixel electrode and said charge sensing node, wherein said pixel capacitor is configured to store charges collected by said charge collecting pixel electrode;
            e) a charge measuring circuit comprising at least one transistor, wherein a gate of said at least one transistor is electrically connected to said charge sensing node;
        3) a radiation absorbing layer comprised of photoconductive material covering at least a portion of said array of pixel circuits, wherein said photoconductive material is photoconductive on exposure to said electron-hole producing radiation;
        4) a surface electrode layer comprised of electrically conducting material and formed on said radiation absorbing layer, wherein said surface electrode layer is at least partially transparent to said electron-hole producing radiation, and connected to a voltage source for establishing an electrical field across said radiation absorbing layer and between said surface electrode layer and each of said array of charge collecting pixel electrodes; and
    B) an array measurement circuit for measuring charges collected by each of said array of charge collecting pixel electrodes, and for outputting pixel data indicative of said collected charges, wherein said pixel data comprises information defining an image.

2. The sensor according to claim 1, wherein a gate of said gate bias transistor is biased by constant voltage to minimize pixel crosstalk among adjacent pixel electrodes within said array of pixel electrodes.

3. The sensor according to claim 1, wherein said charge sensing node comprises metal and provides an electrical connection to said gate of said at least one transistor in said charge measuring circuit.

4. The sensor according to claim 1, wherein said charge sensing node comprises polycrystalline semiconductor material and provides an electrical connection to said gate of said at least one transistor in said charge measuring circuit.

5. The sensor according to claim 1, wherein said charge sensing node comprises a p-type doped region in said substrate and provides an electrical connection to said gate of said at least one transistor in said charge measuring circuits.

6. The sensor according to claim 1, wherein said charge sensing node comprises a n-type doped region in said substrate and provides an electrical connection to said gate of said at least one transistor in said charge measuring circuits.

7. The sensor according to claim 1, wherein each of said array of pixel circuits comprises at least four transistors.

8. The sensor according to claim 1, wherein each of said array of pixel circuits comprises at least six transistors.

9. The sensor according to claim 1, wherein said pixel capacitor is defined by the structure between said charge sensing node and said crystalline semiconductor substrate.

10. The sensor according to claim 1, wherein said radiation absorbing layer comprises hydrogenated amorphous silicon.

11. The sensor according to claim 1, wherein said radiation absorbing layer is a continuous layer.

12. The sensor according to claim 1, wherein said radiation absorbing layer is a discontinuous layer.

13. The sensor according to claim 1, wherein said radiation absorbing layer is a patterned layer.

14. The sensor according to claim 1, wherein said radiation absorbing layer comprises trenches.

15. The sensor according to claim 1, wherein said radiation absorbing layer is substantially planar.

16. The sensor according to claim 1, wherein said radiation absorbing layer is a continuous layer that is fabricated during a continuous deposition process.

17. The sensor according to claim 1, wherein said radiation absorbing layer is a p-n photodiode layered structure, wherein said p-layer is electrically connected to said charge collecting pixel electrode, and said n-layer is electrically connected to said surface electrode layer.

18. The sensor according to claim 1, wherein said radiation absorbing layer is a p-I-n photodiode layered structure, wherein said n-layer is electrically connected to said charge collecting pixel electrode, and said p-layer is electrically connected to said surface electrode layer.

19. The sensor according to claim 18, wherein said p-layer comprises p-type doped hydrogenated amorphous silicon.

20. The sensor according to claim 18, wherein said n-layer comprises n-type doped hydrogenated amorphous silicon.

21. The sensor according to claim 18, wherein said I-layer comprises un-intentionally doped hydrogenated amorphous silicon.

22. The sensor according to claim 1, wherein said radiation absorbing layer is a n-I-p photodiode layered structure, wherein said p-layer is electrically connected to said charge collecting pixel electrode, and said n-layer is electrically connected to said surface electrode layer.

23. The sensor according to claim 22, wherein said p-layer comprises p-type doped hydrogenated amorphous silicon.

24. The sensor according to claim 22, wherein said n-layer comprises n-type doped hydrogenated amorphous silicon.

25. The sensor according to claim 22, wherein said I-layer comprises un-intentionally doped hydrogenated amorphous silicon.

26. The sensor according to claim 1, wherein said radiation absorbing layer comprises a photoconductive un-intentionally doped layer.

27. The sensor according to claim 26, wherein said photoconductive un-intentionally doped layer comprises hydrogenated amorphous silicon.

28. The sensor according to claim 1, wherein said charge collecting pixel electrode comprises a patterned metal plate.

29. The sensor according to claim 1, wherein said charge collecting pixel electrode is formed by a surface of at least one via used for interlayer connection by a semiconductor fabrication process.

30. The sensor according to claim 1, wherein said charge collecting pixel electrode is formed by a surface of a single via.

31. The sensor according to claim 1, wherein said surface electrode layer comprises indium tin oxide.

32. The sensor according to claim 1, wherein said surface electrode layer comprises tin oxide.

33. The sensor according to claim 1, wherein said surface electrode layer comprises titanium nitride.

34. The sensor according to claim 1, wherein a potential difference between adjacent pixel electrodes is in a range of about 1 to about 50 millivolts.

35. The sensor according to claim 1, wherein said sensor comprises a fill factor of at least 40 percent.

36. The sensor according to claim 1, wherein said sensor comprises a fill factor of at least 80 percent.

37. A method of minimizing pixel crosstalk between pixels in an active pixel sensor array comprising:
A) fabricating a solid radiation detection unit comprising:
1) providing a crystalline semiconductor substrate;
2) incorporating a plurality of Complementary Metal Oxide Semiconductor pixel circuits into said substrate to form an array of pixel circuits, wherein each of said array of pixel circuits comprises:
a) a charge collecting pixel electrode;
b) a charge sensing node;
c) a gate bias transistor separating said charge collecting pixel electrode and said charge sensing node and maintaining said pixel electrodes at substantially equal potential;
d) a pixel capacitor comprising said charge collecting pixel electrode and said charge sensing node, wherein said pixel capacitor is configured to store charges collected by said charge collecting pixel electrode;
e) a charge measuring circuit comprising at least one transistor, wherein a gate of said at least one transistor is electrically connected to said charge sensing node;
3) covering at least a portion of said array of pixel circuits with a radiation absorbing layer comprising photoconductive material, wherein said photoconductive material is photoconductive on exposure to said electron-hole producing radiation;
4) forming a surface electrode layer comprising electrically conducting material on said radiation absorbing layer, wherein said surface electrode layer is at least partially transparent to said electron-hole producing radiation, and connected to a voltage source for establishing an electrical field across said radiation absorbing layer and between said surface electrode layer and each of said array of charge collecting pixel electrodes;
B) measuring charges collected by each of said array of charge collecting pixel electrodes with an array measurement circuit; and
C) outputting pixel data indicative of said collected charges of said array of charge collecting pixel electrodes, wherein said pixel data comprises information defining an image.

38. The method according to claim 37, wherein a gate of said gate bias transistor is biased by constant voltage to minimize pixel crosstalk among adjacent pixel electrodes within said array of pixel electrodes.

39. The method according to claim 37, wherein said charge sensing node comprises metal and provides an electrical connection to said gate of said at least one transistor in said charge measuring circuit.

40. The method according to claim 37, wherein said charge sensing node comprises polycrystalline semiconductor material and provides an electrical connection to said gate of said at least one transistor in said charge measuring circuit.

41. The method according to claim 37, wherein said charge sensing node comprises a p-type doped region in said substrate and provides an electrical connection to said gate of said at least one transistor in said charge measuring circuits.

42. The method according to claim 37, wherein said charge sensing node comprises a n-type doped region in said substrate and provides an electrical connection to said gate of said at least one transistor in said charge measuring circuits.

43. The method according to claim 37, wherein each of said array of pixel circuits comprises at least four transistors.

44. The method according to claim 37, wherein each of said array of pixel circuits comprises at least six transistors.

45. The method according to claim 37, wherein said pixel capacitor is defined by the structure between said charge sensing node and said crystalline semiconductor substrate.

46. The method according to claim 37, wherein said radiation absorbing layer comprises hydrogenated amorphous silicon.

47. The method according to claim 37, wherein said radiation absorbing layer is a continuous layer.

48. The method according to claim 37, wherein said radiation absorbing layer is a discontinuous layer.

49. The method according to claim 37, wherein said radiation absorbing layer is a patterned layer.

50. The method according to claim 37, wherein said radiation absorbing layer comprises trenches.

51. The method according to claim 37, wherein said radiation absorbing layer is substantially planar.

52. The method according to claim 37, wherein said radiation absorbing layer is a continuous layer that is fabricated during a continuous deposition process.

53. The method according to claim 37, wherein said radiation absorbing layer is a p-n photodiode layered structure, wherein said p-layer is electrically connected to said charge collecting pixel electrode, and said n-layer is electrically connected to said surface electrode layer.

54. The method according to claim 37, wherein said radiation absorbing layer is a p-I-n photodiode layered structure, wherein said n-layer is electrically connected to said charge collecting pixel electrode, and said p-layer is electrically connected to said surface electrode layer.

55. The method according to claim 54, wherein said p-layer comprises p-type doped hydrogenated amorphous silicon.

56. The method according to claim 54, wherein said n-layer comprises n-type doped hydrogenated amorphous silicon.

57. The method according to claim 54, wherein said I-layer comprises un-intentionally doped hydrogenated amorphous silicon.

58. The method according to claim 37, wherein said radiation absorbing layer is a n-I-p photodiode layered structure, wherein said p-layer is electrically connected to said charge collecting pixel electrode, and said n-layer is electrically connected to said surface electrode layer.

59. The method according to claim 58, wherein said p-layer comprises p-type doped hydrogenated amorphous silicon.

60. The method according to claim 58, wherein said n-layer comprises n-type doped hydrogenated amorphous silicon.

61. The method according to claim 58, wherein said I-layer comprises un-intentionally doped hydrogenated amorphous silicon.

62. The method according to claim 37, wherein said radiation absorbing layer comprises a photoconductive un-intentionally doped layer.

63. The method according to claim 62, wherein said photoconductive un-intentionally doped layer comprises hydrogenated amorphous silicon.

64. The method according to claim 37, wherein said charge collecting pixel electrode comprises a patterned metal plate.

65. The method according to claim 37, wherein said charge collecting pixel electrode is formed by a surface of at least one via used for interlayer connection by a semiconductor fabrication process.

66. The method according to claim 37, wherein said charge collecting pixel electrode is formed by a surface of a single via.

67. The method according to claim 37, wherein said surface electrode layer comprises indium tin oxide.

68. The method according to claim 38, wherein said surface electrode layer comprises tin oxide.

69. The method according to claim 37, wherein said surface electrode layer comprises titanium nitride.

70. The method according to claim 37, wherein a potential difference between adjacent pixel electrodes is in a range of about 1 to about 50 millivolts.

71. The method according to claim 37, wherein said sensor comprises a fill factor of at least 40 percent.

72. The method according to claim 37, wherein said sensor comprises a fill factor of at least 80 percent.

* * * * *